United States Patent
Basu et al.

(10) Patent No.: US 9,520,496 B2
(45) Date of Patent: Dec. 13, 2016

(54) CHARGE CARRIER TRANSPORT FACILITATED BY STRAIN

(71) Applicant: International Business Machines Corporation, Armonk, NY (US)

(72) Inventors: Anirban Basu, Legrangeville, NY (US); Guy M. Cohen, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/585,474

(22) Filed: Dec. 30, 2014

(65) Prior Publication Data
US 2016/0190316 A1 Jun. 30, 2016

(51) Int. Cl.
| | |
|---|---|
| H01L 29/66 | (2006.01) |
| H01L 29/78 | (2006.01) |
| H01L 29/205 | (2006.01) |
| H01L 29/04 | (2006.01) |
| H01L 21/306 | (2006.01) |
| H01L 21/02 | (2006.01) |

(52) U.S. Cl.
CPC ..... *H01L 29/7848* (2013.01); *H01L 21/02546* (2013.01); *H01L 21/30612* (2013.01); *H01L 29/045* (2013.01); *H01L 29/205* (2013.01); *H01L 29/66522* (2013.01)

(58) Field of Classification Search
None
See application file for complete search history.

(56) References Cited

U.S. PATENT DOCUMENTS

| | | | |
|---|---|---|---|
| 4,771,325 A | 9/1988 | Cheng et al. | |
| 8,084,838 B2 | 12/2011 | Luryi | |
| 8,487,409 B2 | 7/2013 | Okita | |
| 8,501,508 B2 | 8/2013 | Majhi et al. | |
| 2003/0042503 A1 | 3/2003 | Hartmann | |
| 2005/0040386 A1* | 2/2005 | Choa ............... | B82Y 20/00 257/14 |

(Continued)

FOREIGN PATENT DOCUMENTS

| | | |
|---|---|---|
| JP | 10190143 A | 7/1998 |
| JP | 10242571 A | 9/1998 |
| WO | 9702608 A1 | 1/1997 |

OTHER PUBLICATIONS

Iyer, et al., "Semiinsulating properties of Fedoped InP grown by hydride vapor phase epitaxy", Journal of Applied Physics 66, 5880 (1989), doi: 10.1063/1.343611, AIP Publishing, J. Appl. Phys., vol. 66, No. 12, Dec. 15, 1989, pp. 5880-5884.

(Continued)

*Primary Examiner* — Reema Patel
(74) *Attorney, Agent, or Firm* — Adolph Bohnstedt

(57) ABSTRACT

A semiconductor structure and formation thereof. The semiconductor structure has a first semiconductor layer with a first lattice structure and a second epitaxial semiconductor layer that is lattice-matched with the first semiconductor layer. At least two source/drain regions, which have a second lattice structure, penetrate the second semiconductor layer and contact the first semiconductor layer. A portion of the second semiconductor layer is between the source/drain regions and has a degree of uniaxial strain that is based, at least in part, on a difference between the first lattice structure and the second lattice structure.

20 Claims, 8 Drawing Sheets

(56) References Cited

U.S. PATENT DOCUMENTS

2010/0163847 A1\* 7/2010 Majhi .............. H01L 21/28518
257/24

OTHER PUBLICATIONS

Yin, et al., "Tunable uniaxial vs biaxial in-plane strain using compliant substrates", Applied Physics Letters 87, 061922 s2005d, DOI: 10.1063/1.2006215, © 2005 American 87, 061922-1 Institute of Physics.
Mahato, et al., "Strain Engineering for Future CMOS Technologies", 3rd International Conference on Computers and Devices for Communication (CODEC-06), Institute of Radio Physics and Electronics, University of Calcutta, Dec. 18-20, 2006.
Oye, et al. "Molecular-beam epitaxy growth of device-compatible GaAs on silicon substrates with thin ( 80 nm ) Si 1 x Ge x step-graded buffer layers for high-III-V metal-oxidesemiconductor field effect transistor applications", Journal of Vacuum Science & Technology B 25, 1098 (2007); doi: 10.1116/1.2713119, pp. 1098-1102.
Suthram, et al. "Strain Additivity in III-V Channels for CMOSFETs beyond 22nm Technology Node", 978-1-4244-1805-3/08, © 2008 IEEE, 2008 Symposium on VLSI Technology Digest of Technical Papers, pp. 182-183.
Zhao, et al., "Impact of Uniaxial Strain on the Electrical Characteristics of MOSFETs and Esaki Tunnel Diodes", A Dissertation Submitted to the Graduate School of the University of Notre Dame in Partial Fulfillment of the Requirements for the Degree of Doctor of Philosophy by Wei Zhao, Copyright by Wei Zhao, 2006, pp. 1-121.

\* cited by examiner

CHARGE CARRIER TRANSPORT FACILITATED BY STRAIN

BACKGROUND OF THE INVENTION

The present invention relates generally to the field of semiconductor structures, and more particularly to the inducement of strain on field-effect transistor channels.

A pure semiconductor is a poor electrical conductor as a consequence of having just the right number of electrons to completely fill its valence bonds. Through various techniques (e.g. doping or gating), the semiconductor can be modified to have an excess of electrons (becoming an n-type semiconductor) or a deficiency of electrons (becoming a p-type semiconductor). In both cases, the semiconductor becomes much more conductive (the conductivity can be increased by one million-fold or more). Semiconductor devices exploit this effect to shape electrical current. The study of semiconductor materials is an important area of material science research due to their application in devices such as transistors and therefore computers.

The most commonly used semiconductor materials are crystalline inorganic materials, which are classified according to the periodic table groups of their constituent atoms and also whether they are composed of a single element or more than one element. For example, silicon (Si) is a common semiconductor material and it is a group IVA element so it is classified as a group IV elemental semiconductor. Silicon-germanium (SiGe) is an alloy of two different group IVA elements so it is classified as a group IV compound semiconductor. When a semiconductor is composed of two or more elements from different periodic table groups, indicating compound vs. element is no longer necessary. Thus, lead sulfide (PbS) is composed of a group IVA element (Pb) and a group VIA element (S) so it is referred to as a IV-VI semiconductor. Likewise, indium phosphide (InP) is composed of a group IIIA element (In) and a group VA element (P) so it is a III-V semiconductor. There are several other classes of semiconductors of varying popularity (e.g., II-VI, I-VII, V-VI, II-V). Finally, semiconductors composed of two different elements are binary (e.g., InP), semiconductors with three different elements are ternary (e.g. the III-V semiconductor indium gallium arsenide (In-GaAs)), and those with four and five different elements are quaternary and quinary, respectively.

Doping is the introduction of impurities to a semiconductor in order to vary its electronic nature. Depending on how it is doped, a semiconductor can be made to be n-type or p-type. For example, Si can be made n-type by doping with phosphorus. Phosphorus (P) has one more valence electron than Si and its incorporation into the Si crystal lattice creates a preponderance of nonbonding electrons, which are available as negative charge carriers. The "n" in n-type stands for "negative" and indicates that electrons are the majority charge carriers. If Boron were used as the dopant instead of P, the Si would become a p-type semiconductor. Boron (B) has one less valence electron than Si, which means it can only form covalent bonds with three Si atoms in the Si crystal lattice. The absence of an electron where one could exist in an atomic lattice is referred to as a hole. Electrons can migrate hole-to-hole leaving a hole behind each time. Thus, p-type semiconductors have moving holes as majority charge carriers and the "p" stands for "positive."

Field-effect transistors (FETs) are transistors that employ an electric field to control the conductivity of a channel in which one of the two types of charge carriers may travel. A FET is composed of a source and a drain connected by the channel through which the charge carriers, electrons or holes, pass when voltage is applied to a gate. The gate sits over the channel separated by an insulating material referred to as the gate dielectric. Applying voltage to the gate changes the amount of charge carriers in the channel thereby controlling the current in the device.

Charge carrier transport that is typically described by mobility through FET channels is an important factor for optimal performance. One way charge carrier transport can be modulated is through strain. For example, strained channels have been successfully integrated into Si- and Ge-based metal oxide semiconductor FETs (MOSFETs) to enhance carrier mobility. Strain can be in the form of biaxial or uniaxial strain and may be compressive or tensile. A biaxial strained crystal has stress introduced in two directions (x-y) along its surface whereas a uniaxial strained crystal has stress introduced in only one direction. Compressive strain occurs when the crystal lattice is being compressed whereas tensile strain occurs when the crystal lattice is being stretched. In silicon, compressive strain facilitates hole mobility and tensile strain facilitates electron mobility.

Enhancing charge carrier transport for FETs through the use of uniaxial strain is an ongoing challenge. For example, high mobility, narrow band gap III-V materials are considered strong contenders to replace strained-Si channels. However, even though these III-V materials demonstrate high electron mobility, they are less promising for hole transport due to intrinsic lower hole mobility when compared with strained-Si. Eventual integration of III-V based semiconductors as MOSFET channels requires both high performance n- and p-MOSFETS. Thus, methods for fabricating III-V-based p-FETs with uniaxial compressive strained channel regions in order to improve hole transport is of significant interest.

SUMMARY

According to one embodiment of the present disclosure, a structure comprising a semiconductor structure. The semiconductor structure includes a first semiconductor layer with a first lattice structure and a second epitaxial semiconductor layer that is lattice-matched with the first semiconductor layer. At least two source/drain regions, which have a second lattice structure, penetrate the second semiconductor layer and contact the first semiconductor layer. A portion of the second semiconductor layer is between the source/drain regions and has a degree of uniaxial strain that is based, at least in part, on a difference between the first lattice structure and the second lattice structure.

According to one embodiment of the present disclosure, a method of forming a semiconductor structure is provided. The method including forming a layer of a first semiconductor material on top of a layer of a semi-insulating semiconductor material. The first semiconductor material and the semi-insulating semiconductor material are lattice-matched. The layer of first semiconductor material is etched to a depth that, at least, exposes the semi-insulating semiconductor material and forms a semiconductor channel region with a first end and a second end. A first source/drain region is formed at the first end of the semiconductor channel region and a second source/drain region is formed at the second end of the semiconductor channel region. The first source/drain region and the second source/drain region include a second semiconductor material. The second semiconductor material is lattice-mismatched to the first semiconductor material and to the semi-insulating semiconductor material.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
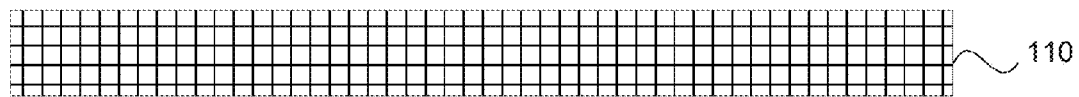
FIG. 1A illustrates a cross-sectional view depicting a semi-insulated (SI) semiconductor layer, in accordance with an exemplary embodiment of the present invention.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below in conjunction with FIGS. 1-8, embodiments may include methods of forming field-effect transistors (FETs) that have uniaxial strained channel regions separating the source device from the drain device. The methods described below in conjunction with FIGS. 1-8 may be incorporated into typical semiconductor fabrication processes.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As used herein, terms such as "depositing", "forming", and the like refer to the disposition of layers or portions of materials in the present embodiments. Such processes may not be different than in the standard practice of the art of FET fabrication. Such practice include but are not limited to, metalorganic chemical vapor deposition (MOCVD), atomic layer deposition (ALD), chemical vapor deposition (CVD), low-pressure chemical vapor deposition (LPCVD), plasma enhanced chemical vapor deposition (PECVD), ultrahigh vacuum chemical vapor deposition (UHVCVD), physical vapor deposition, sputtering, plating, evaporation, ion beam deposition, electron beam deposition, laser assisted deposition, chemical solution deposition, or any combination of those methods.

As used herein, the term "lattice-matched" and the like refer to adjoining epitaxial semiconductor materials (including SI semiconductor materials), which have essentially the same lattice constants and, hence, strain is not induced by the epitaxial growth of a layer that is lattice-matched to the substrate upon which it is deposited Likewise, the term "lattice-mismatched" and the like refer to adjoining epitaxial semiconductor materials (including SI semiconductor materials), which do not have essentially the same lattice constants and, hence, strain is induced by the epitaxial growth of one of the materials next to or on top of the lattice-mismatched material.

As used herein, semiconductor structures refer to one or more physical structures that comprise semiconductor devices.

The present invention will now be described in detail with reference to the Figures.

FIG. 1A illustrates a cross-sectional view depicting a SI semiconductor layer 110, in accordance with an exemplary embodiment of the present invention. In various embodiments, SI semiconductor layer 110 is an epitaxial layer of an SI semiconductor lattice-matched to a graded buffer layer, which is in turn deposited onto a silicon substrate. In an exemplary embodiment, SI semiconductor layer 110 is deposited on top of a virtual III-V on Silicon (Si) substrate. For example, SI semiconductor layer 110 is a layer of epitaxial SI indium phosphide (InP). InP is turned into an SI semiconductor by doping it with impurities such as iron (Fe) or chromium (Cr), which act as traps for free carriers. The thickness of a typical SI InP layer ranges from about 100 nm to about 5000 nm.

Figure 1B:
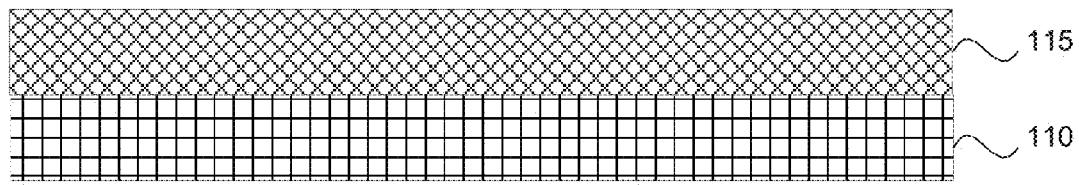
FIG. 1B illustrates a cross-sectional view depicting the formation of a semiconductor layer on the SI semiconductor layer of FIG. 1A, in accordance with an exemplary embodiment of the present invention.

FIG. 1B illustrates a cross-sectional view depicting the formation of a semiconductor layer 115 on the SI semiconductor layer 110 of FIG. 1A, in accordance with an exemplary embodiment of the present invention. In various embodiments, semiconductor layer 115 is lattice-matched to the SI semiconductor crystal of SI semiconductor layer 110. In one embodiment, the semiconductor layer 115 is a III-V semiconductor material that is lattice-matched to SI semiconductor layer 110. For example, SI semiconductor layer 110 is composed of epitaxial Fe-doped InP and semiconductor layer 115 is a semiconductor material that is lattice-matched to Fe-doped InP, such as $In_{0.53}Ga_{0.47}As$.

Figure 2A:
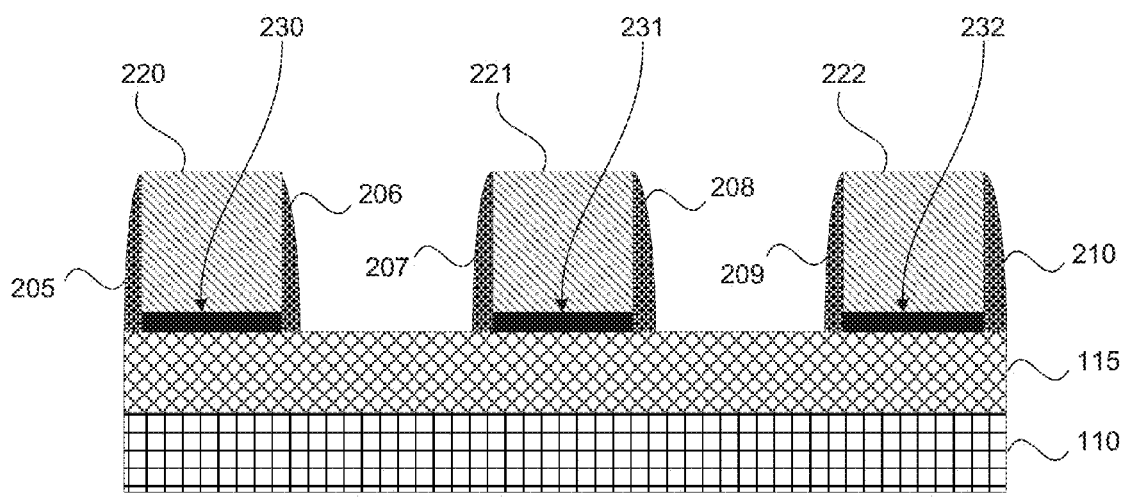
FIG. 2A illustrates a cross-sectional view depicting the formation of a plurality of gate structures on the semiconductor layer of FIG. 1B, in accordance with an exemplary embodiment of the present invention.

FIG. 2A illustrates a cross-sectional view depicting the formation of a plurality of gate structures on the semiconductor layer 115 of FIG. 1B, in accordance with an exemplary embodiment of the present invention. The gate structures include gate conductors 220-222, spacers 205-210, and gate dielectrics 230-232. Gate conductors 220, 221, and 222 rest directly on top of gate dielectrics 230, 231, and 232, respectively and are in contact between spacer pairs 205/206, 207/208, 209/210, respectively. Gate conductors 220-222 are composed of conductive material, typically metals. Spacers are composed of an insulator such as silicon dioxide ($SiO_2$) or silicon nitride ($Si_3N_4$). Gate dielectrics 230-232 are also composed of an insulator, typically $SiO_2$ or a high-κ dielectric metal oxide such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The formation of gate structures as embodied by FIG. 2A is well understood by those skilled in the art and, as such, a detailed description of such processes is not presented herein.

Figure 2B:
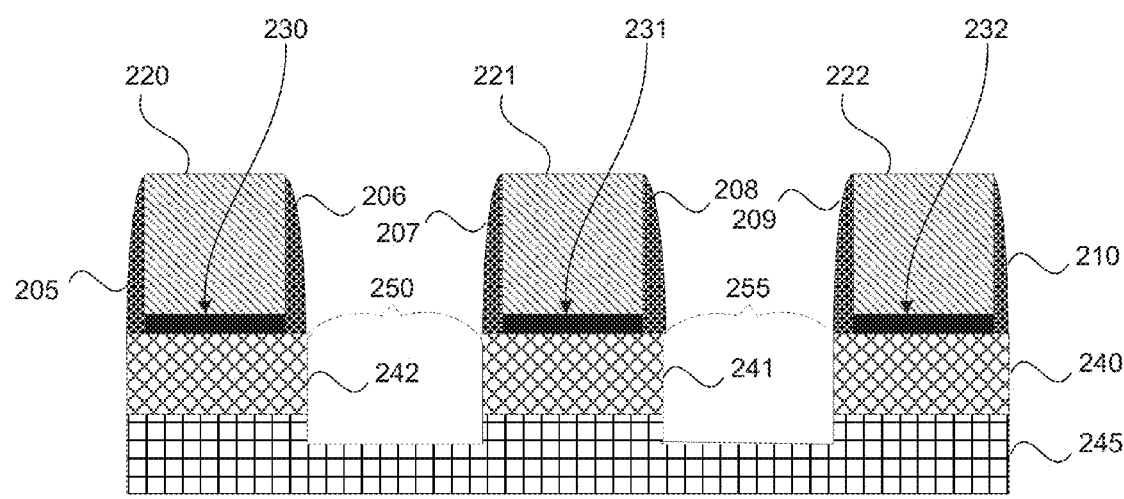
FIG. 2B illustrates a cross-sectional view depicting the removal of the semiconductor layer along with a portion of the SI semiconductor layer adjacent to the gate structures from the structure depicted in FIG. 2A, thereby defining semiconductor channel regions and providing an etched SI semiconductor layer in accordance with an exemplary embodiment of the present invention.

FIG. 2B illustrates a cross-sectional view depicting the removal of the semiconductor layer 115 along with a portion of the SI semiconductor layer 110 adjacent to the gate structures from the structure depicted in FIG. 2A, thereby defining the device's semiconductor channel regions 240-242 and providing etched SI semiconductor layer 245 in accordance with an exemplary embodiment of the present invention. In this embodiment, reactive ion etching (RIE) removes all of the semiconductor material and a portion of the SI semiconductor material between the gate structures to create trenches 250 and 255. The gate structures serve as a mask, so the etched trenches 250 and 255 are said to be self-aligned to the channel regions 240-242. Although the embodiment described is created using RIE, other dry etching processes will work to obtain the shown anisotropic etch. In this embodiment, semiconductor channel regions 240, 241, and 242 rest on top of the highest surfaces of etched SI semiconductor layer 245 and underneath the three gate structures. The semiconductor channel regions 240-242 and the upper sidewalls of trenches 250 and 255 are composed of the semiconductor material of semiconductor layer 115 (FIG. 2A). The etched SI semiconductor layer 245 as well as the lower sidewalls and floors of trenches 250 and 255 are composed of the SI semiconductor material of SI semiconductor layer 110.

Figure 3A:
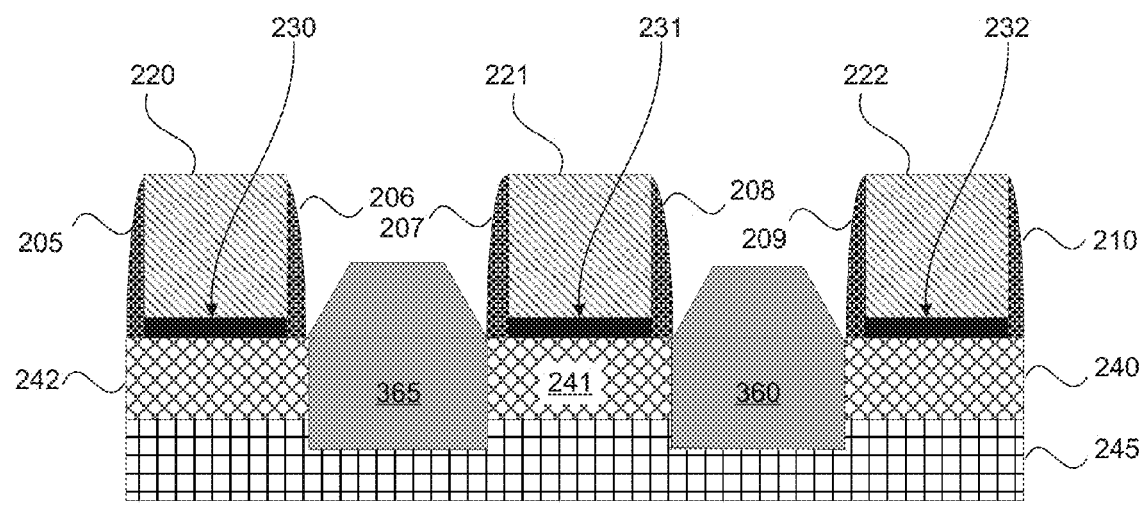
FIG. 3A illustrates a cross-sectional view depicting the formation of source/drain regions on the lower surfaces of the etched SI semiconductor layer and adjacent to the semiconductor channel regions of the structure depicted in FIG. 2B, in accordance with an exemplary embodiment of the present invention.

FIG. 3A illustrates a cross-sectional view depicting the formation of source/drain regions 360 and 365 on the lower surfaces of the etched SI semiconductor layer 245 and adjacent to the semiconductor channel regions 240-242 of the structure depicted in FIG. 2B, in accordance with an exemplary embodiment of the present invention. In various embodiments, source/drain regions 360 and 365 are composed of semiconductor material that is lattice-mismatched to the semiconductor material of semiconductor channel regions 240-242 as well as lattice-mismatched to the SI semiconductor material of etched SI semiconductor layer 245. In an exemplary embodiment, semiconductor channel regions 240-242 are composed of a III-V semiconductor material, etched SI semiconductor layer 245 includes a top layer of epitaxial SI semiconductor material that is a lattice-matched to the III-V semiconductor material, and source/drain regions 360 and 365 are composed of a III-V semiconductor material that is lattice-mismatched with both semiconductor channel regions 240-242 and the top layer material of etched SI semiconductor layer 245. In one example, SI semiconductor layer 245 is composed of epitaxial Fe-doped InP, semiconductor channel regions 240-242 are composed of a semiconductor material that is lattice-matched to Fe-doped InP, such as $In_{0.53}Ga_{0.47}As$, and source/drain regions 360 and 365 are composed of $In_yGa_{(1-y)}As$ where y>0.53. In this exemplary embodiment, semiconductor channel regions 240-242 experience compressive uniaxial strain because the source/drain regions 360 and 365 have a larger lattice constant than the semiconductor channel regions 240-242. Compressive uniaxial strain enhances charge carrier transport in p-FET devices. In another exemplary embodiment, the composition of channels 240-242 remains $In_{0.53}Ga_{0.47}As$, etched SI semiconductor layer 245 remains epitaxial Fe-doped InP, but source/drain regions 360 and 365 are composed of $In_yGa_{(1-y)}As$ where y<0.53. In this exemplary embodiment, semiconductor channel regions 240-242 exhibit tensile uniaxial strain because the source/drain regions 360 and 365 have a smaller lattice constant than the semiconductor channel regions 240-242. Tensile uniaxial strain enhances charge carrier transport in n-FET devices.

Using the above example, the deposition of source/drain regions 360 and 365 can be done using a metal-organic chemical vapor deposition (MOCVD) reactor with trimethylindium (TMIn) as the indium source, trimethylgallium (TEG) as the gallium source, and arsine ($AsH_3$) as the arsenic source. In such embodiment of the invention, the deposition temperatures may typically range from 400° C. to 650° C. The source and drain regions 360 and 365 also need to be doped. Doping of a semiconductor is typically achieved by using impurities that substitute a group III or a group V atom. For example, when $In_{0.53}Ga_{0.47}As$ is used, impurities such as silicon (Si), tin (Sn), selenium (Se), and tellurium (Te) would make the semiconductor to be n-type where majority carriers would be electrons. When carbon (C), beryllium (Be), or zinc (Zn) are used the $In_{0.53}Ga_{0.47}As$ semiconductor would be p-type doped and majority carriers would comprise holes. For n-FET devices n-type doping is used in the source and drain region, while for p-FETs devices p-type doping is used. In-situ silicon doping may be practiced during the deposition of the $In_{0.53}Ga_{0.47}As$ semiconductor. For example, when MOCVD growth is used silane ($SiH_4$) may be added to the gas mixture during the deposition of source and drain to obtain Si doping. Other precursors that may be used are silicon tetrabromide ($SiBr_4$) and silicon tetrachloride ($SiCl_4$). To obtain p-type doping, carbon tetrabromide ($CBr_4$) may be used as the carbon source.

Figure 3B:
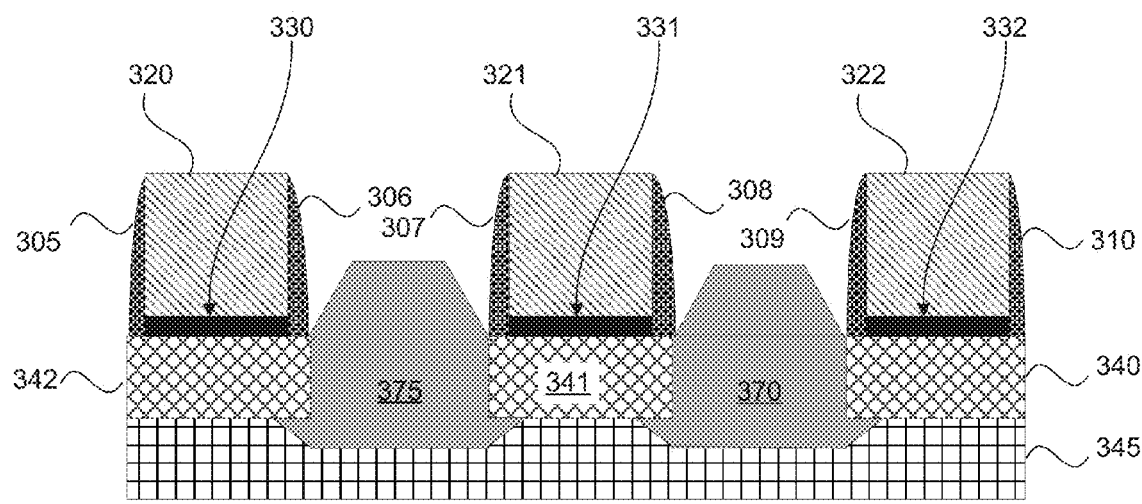
FIG. 3B illustrates a cross-sectional view depicting recessed source/drain regions in a structure analogous to the one depicted in FIG. 3A, in accordance with an exemplary embodiment of the present invention.

FIG. 3B illustrates a cross-sectional view depicting recessed source/drain regions 370 and 375 in a structure analogous to the one depicted in FIG. 3A, in accordance with an exemplary embodiment of the present invention. The elements seen in the embodiment exemplified by FIG. 3B are analogous to those in FIG. 3A. Gate conductors 320-322 have spacers 305-310 adjacent to them and in direct contact. Gate dielectrics 330-332 separate the conducting gate conductors from the semiconductor channel regions 340-342. Source/drain regions 370 and 375 rest on the lower surfaces of etched SI semiconductor layer 345 and are adjacent to at least one semiconductor channel region. This exemplary embodiment has at least 2 fundamental differences compared to the FIG. 3A embodiment: i) The etches in etched SI semiconductor layer 345 include a lateral etch, which is typically practiced with a wet etching process; and ii) bottom portions of source/drain region 370 are wedged underneath semiconductor channel regions 340 and 341 and bottom portions of source/drain region 375 are wedged underneath semiconductor channel regions 341 and 342. In various embodiments, source/drain regions 370 and 375 are composed of semiconductor material that is lattice-mismatched to the semiconductor material of semiconductor channel regions 340-342 as well as lattice-mismatched to the SI semiconductor material of etched SI semiconductor layer 345. In an exemplary embodiment, semiconductor channel regions 340-342 are composed of a III-V semiconductor material, etched SI semiconductor layer 345 is a layer of epitaxial SI semiconductor material that is a lattice-matched to the III-V semiconductor material, and source/drain regions 370 and 375 are composed of a III-V semiconductor material that is lattice-mismatched with both semiconductor channel regions 340-342 and the SI semiconductor material of etched SI semiconductor layer 345. In one example, SI semiconductor layer 345 is a layer of epitaxial Fe-doped InP, semiconductor channel regions 340-342 are composed of an semiconductor material that is lattice-matched to Fe-doped InP, such as $In_{0.53}Ga_{0.47}As$, and source/drain regions 370 and 375 are composed of $In_yGa_{(1-y)}As$ where y>0.53 to enhance charge carrier transport in a p-FET device. Alternatively, another example would include source/drain region compositions of $In_yGa_{(1-y)}As$ where y<0.53 to enhance charge carrier transport in an n-FET device. It should be noted that the shape of the source/drain regions 370 and 375 augment the strain experienced by semiconductor channel regions 340-342 as compared to the shape of source/drain regions 360 and 365 and their effect on channel regions 240-242 (FIG. 3A).

FIGS. 4-8 show processes for an exemplary embodiment of the present invention in which the gate structures are fabricated after the source/drain regions.

Figure 4A:
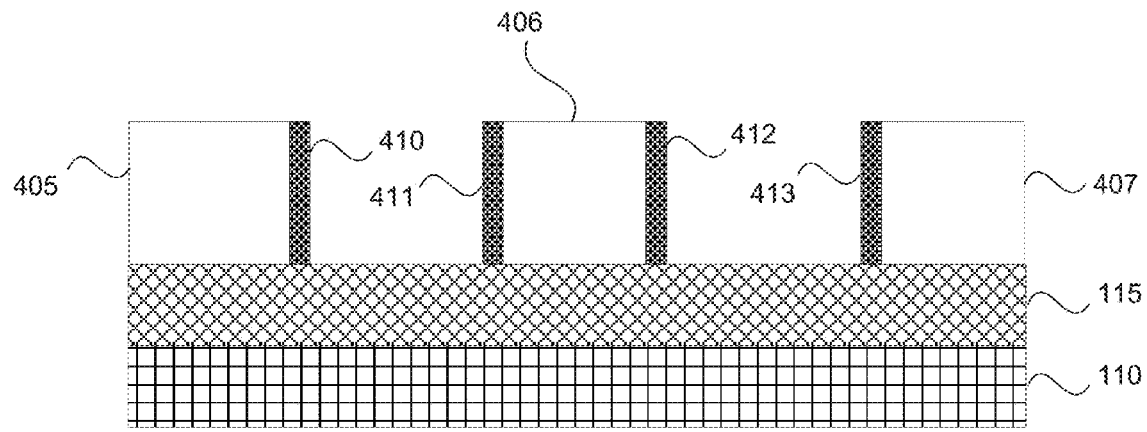
FIG. 4A illustrates a cross-sectional view depicting the formation of a plurality of sacrificial gates with adjoining spacers on the semiconductor layer of FIG. 1B, in accordance with an exemplary embodiment of the present invention.

FIG. 4A illustrates a cross-sectional view depicting the formation of a plurality of sacrificial gates 405-407 with adjoining spacers 410-413 on the semiconductor layer 115 of FIG. 1B, in accordance with an exemplary embodiment of the present invention. In various embodiments, sacrificial gates 405-407 are composed of any material or combination of materials that will act as a protecting layer during subsequent fabrication steps. In various embodiments, spacers 410-413 are composed of an insulator such as $SiO_2$ or $Si_3N_4$. As shown in FIG. 4A, spacers 410-413 are adjacent to and in direct contact with the sacrificial gate elements and orthogonal to and in direct contact with semiconductor layer 115. The formation of sacrificial gates as embodied by FIG. 4A is well understood by those skilled in the art and, as such, a detailed description of such processes is not presented herein.

Figure 4B:
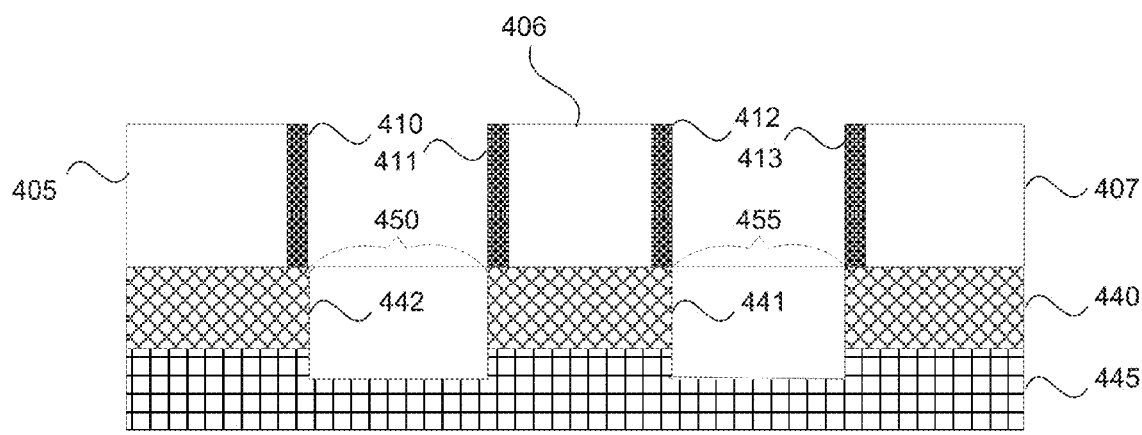
FIG. 4B illustrates a cross-sectional view depicting the removal of the semiconductor layer along with a portion of the SI semiconductor layer adjacent to the spacers from the structure depicted in FIG. 4A, thereby forming semiconductor channel regions and an etched SI semiconductor layer in accordance with an exemplary embodiment of the present invention.

FIG. 4B illustrates a cross-sectional view depicting the removal of the semiconductor layer 115 along with a portion of the SI semiconductor layer 110 adjacent to the spacers 410-413 from the structure depicted in FIG. 4A, thereby defining semiconductor channel regions 440-442 and an etched SI semiconductor layer 445 in accordance with an exemplary embodiment of the present invention. In this embodiment, reactive ion etching (RIE) removes all of the semiconductor material and a portion of the SI semiconductor material between spacers 410 and 411 as well as between spacers 412 and 413 to create trenches 450 and 455. Although the embodiment described is created using RIE, other dry etching processes will work to obtain the shown anisotropic etch. In this embodiment, semiconductor channel regions 440, 441, and 442 are created underneath the sacrificial gate/spacer elements and rest on top of the highest surfaces of etched SI semiconductor layer 445. The semiconductor channel regions 440-442 and the upper sidewalls of trenches 450 and 455 are composed of the semiconductor material of semiconductor layer 115. The etched SI semiconductor layer 445 as well as the lower sidewalls and floors of trenches 450 and 455 are composed of the SI semiconductor material of SI semiconductor layer 110.

Figure 5A:
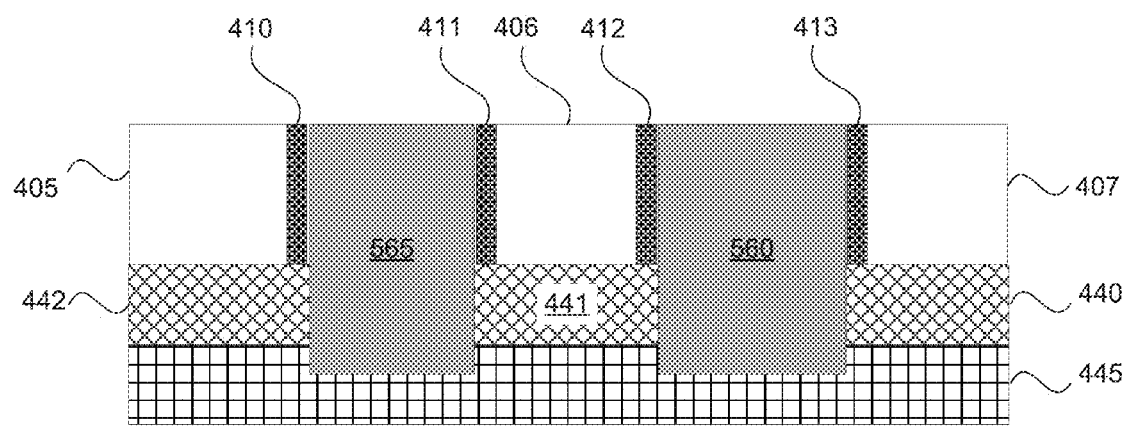
FIG. 5A illustrates a cross-sectional view depicting the formation of source/drain regions on the lower surfaces of the etched SI semiconductor layer and adjacent to the semiconductor channel regions and spacers of the structure depicted in FIG. 4B, in accordance with an exemplary embodiment of the present invention.

FIG. 5A illustrates a cross-sectional view depicting the formation of source/drain regions 560 and 565 on the lower surfaces of the etched SI semiconductor layer 445 and adjacent to the semiconductor channel regions 440-442 and spacers 410-413 of the structure depicted in FIG. 4B, in accordance with an exemplary embodiment of the present invention. In various embodiments, source/drain regions 560 and 565 are composed of semiconductor material that is lattice-mismatched to the semiconductor material of semiconductor channel regions 440-442 as well as lattice-mismatched to the SI semiconductor material of etched SI semiconductor layer 445. In an exemplary embodiment, semiconductor channel regions 440-442 are composed of a III-V semiconductor material, etched SI semiconductor layer 445 is an etched layer of epitaxial SI semiconductor material that is a lattice-matched to the III-V semiconductor material, and source/drain regions 560 and 565 are composed of another III-V semiconductor material that is lattice-mismatched with both semiconductor channel regions 440-442 and the SI semiconductor material of etched SI semiconductor layer 445. For example, SI semiconductor layer 445 includes a top layer of epitaxial Fe-doped InP, semiconductor channel regions 440-442 are composed of an alloy that is lattice-matched to Fe-doped InP, such as $In_{0.53}Ga_{0.47}As$, and source/drain regions 560 and 565 are composed of $In_yGa_{(1-y)}As$ where $y>0.53$ to provide enhanced charge carrier transport in a p-FET device. Alternatively, another example would include source/drain region compositions of $In_yGa_{(1-y)}As$ where $y<0.53$ to provide enhanced charge carrier transport in an n-FET device. Source/drain regions 560 and 565 are typically overgrown and then polished back by chemical mechanical polishing (CMP) so that they make an even top surface with sacrificial gates 405-407 and spacers 410-413.

Figure 5B:
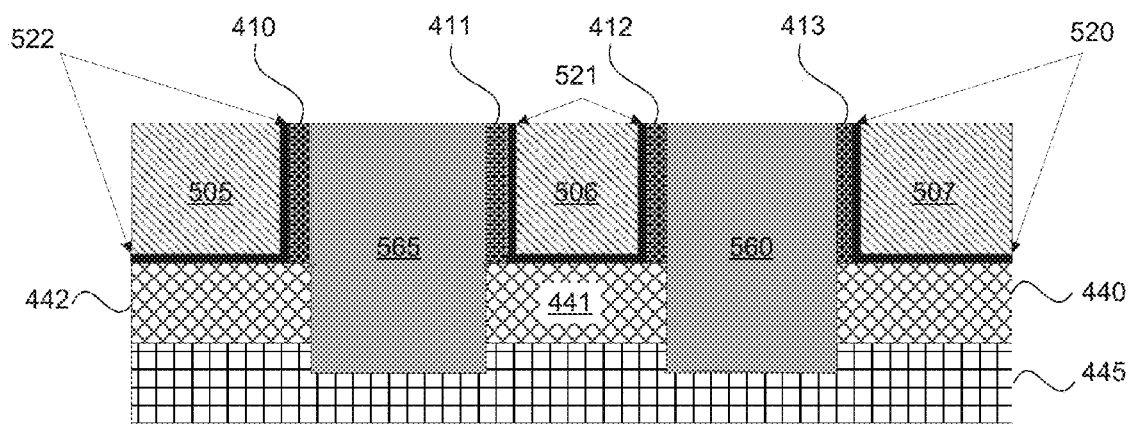
FIG. 5B illustrates a cross-sectional view depicting the removal of hard mask regions from the structure of FIG. 5A, formation of gate dielectric layers along the exposed spacer sidewalls and exposed semiconductor channel region surfaces, and formation of gate conductors, in accordance with an exemplary embodiment of the present invention.

FIG. 5B illustrates a cross-sectional view depicting the removal of sacrificial gates 405-407 from the structure of FIG. 5A, formation of gate dielectric layers 520-522 along the exposed spacer 410-413 sidewalls and exposed semiconductor channel region 440-442 surfaces, and formation of gate conductors 505-507, in accordance with an exemplary embodiment of the present invention. In various embodiments, gate dielectric layers 520-522 are composed of insulators such as silicon dioxide or a high-κ dielectric metal oxide such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In various embodiments, gate conductors 505-507 are composed of a conducting metal.

Figure 6A:
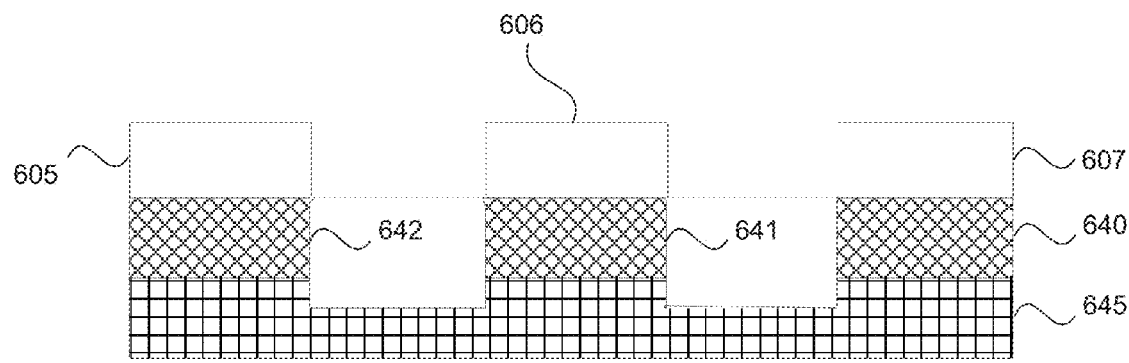
FIG. 6A illustrates a cross-sectional view depicting semiconductor channel regions on top of the upper surfaces of an etched SI semiconductor layer with hard mask regions on top of said semiconductor channel regions, in accordance with an exemplary embodiment of the present invention.

FIG. 6A illustrates a cross-sectional view depicting semiconductor channel regions 640-642 on top of the upper surfaces of etched SI semiconductor layer 645 with hard mask regions 605-607 on top of semiconductor channel regions 640-642, in accordance with an exemplary embodiment of the present invention. In various embodiments, semiconductor channel regions 640-642 and etched SI semiconductor layer 645 are composed of semiconductor and SI semiconductor materials, respectively, which are lattice-matched to each other. In some embodiments, semiconductor channel regions 640-642 are composed of a III-V semiconductor material and etched SI semiconductor layer 645 is composed of an SI semiconductor material that is lattice-matched with said III-V semiconductor material. For example, semiconductor channel regions 640-642 are composed of $In_{0.53}Ga_{0.47}As$ and etched SI semiconductor layer is composed of Fe-doped InP. Hard mask regions 605-607 are composed of any material that serves to protect underlying structural elements during fabrication processes. The formation of the structures such as the one embodied by FIG. 4A is well understood by those skilled in the art and, as such, a detailed description of such processes is not presented herein.

Figure 6B:
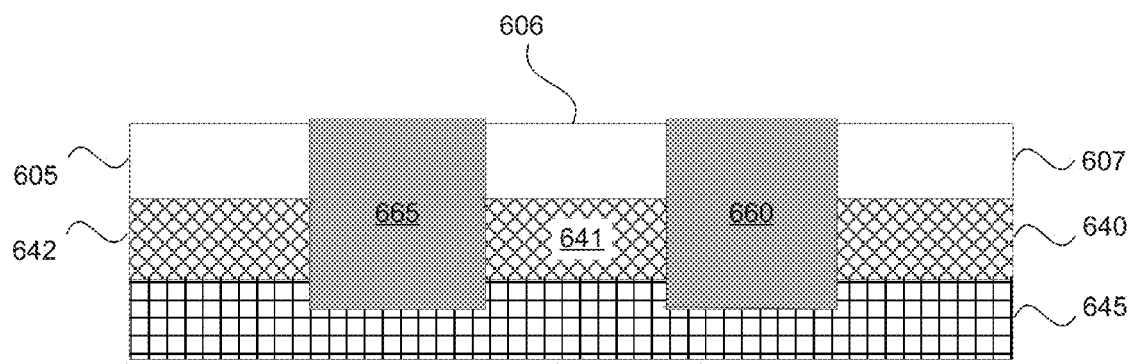
FIG. 6B illustrates a cross-sectional view depicting the formation of source/drain regions on the lower surfaces of the etched SI semiconductor layer and adjacent to the semiconductor channel regions and hard mask regions of the structure depicted in FIG. 6A, in accordance with an exemplary embodiment of the present invention.

FIG. 6B illustrates a cross-sectional view depicting the formation of source/drain regions 660-665 on the lower surfaces of the etched SI semiconductor layer 645 and adjacent to the semiconductor channel regions 640-642 and hard mask regions 605-607 of the structure depicted in FIG. 6A, in accordance with an exemplary embodiment of the present invention. In various embodiments, source/drain regions 660 and 665 are composed of semiconductor material that is lattice-mismatched to the semiconductor material of semiconductor channel regions 640-642 as well as lattice-mismatched to the SI semiconductor material of etched SI semiconductor layer 645. In an exemplary embodiment, semiconductor channel regions 640-642 are composed of a III-V semiconductor material, etched SI semiconductor layer 645 is composed of an epitaxial SI semiconductor material that is a lattice-matched to the III-V semiconductor material, and source/drain regions 660 and 665 are composed of a III-V semiconductor material that is lattice-mismatched with both the semiconductor channel regions 640-642 and the SI semiconductor material of etched SI semiconductor layer 645. For example, SI semiconductor layer 645 is layer of epitaxial Fe-doped InP, semiconductor channel regions 640-642 are composed of an alloy that is lattice-matched to Fe-doped InP, such as $In_{0.53}Ga_{0.47}As$, and source/drain regions 660 and 665 are composed of $In_yGa_{(1-y)}As$ where $y>0.53$ to enhance charge carrier transport in a p-FET device. Alternatively, another example would include source/drain region compositions where $y<0.53$ to enhance charge carrier transport in an n-FET device.

Figure 7A:
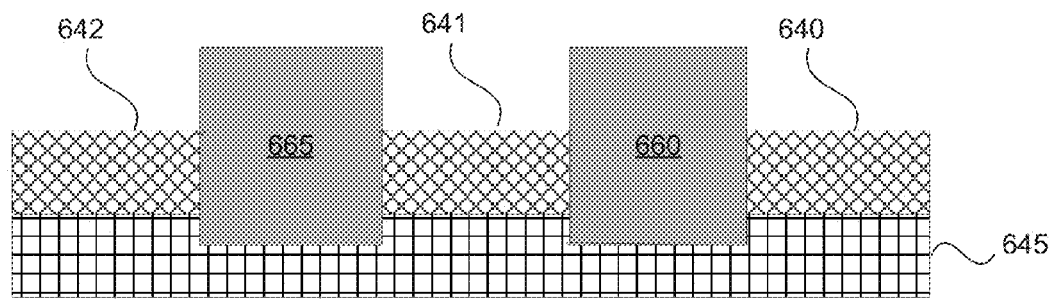
FIG. 7A illustrates a cross-sectional view depicting the removal of hard mask regions from the structure depicted in FIG. 6B, in accordance with an exemplary embodiment of the present invention.

FIG. 7A illustrates a cross-sectional view depicting the removal of hard mask regions 605-607 from the structure depicted in FIG. 6B, in accordance with an exemplary embodiment of the present invention. After the removal of the hard mask, source/drain regions 660 and 665 project upwards at a level higher than the newly exposed surfaces of semiconductor channel regions 640-642. The removal of hard mask regions such as regions 605-607 is well understood by those skilled in the art and, as such, a detailed description of such processes is not presented herein.

Figure 7B:
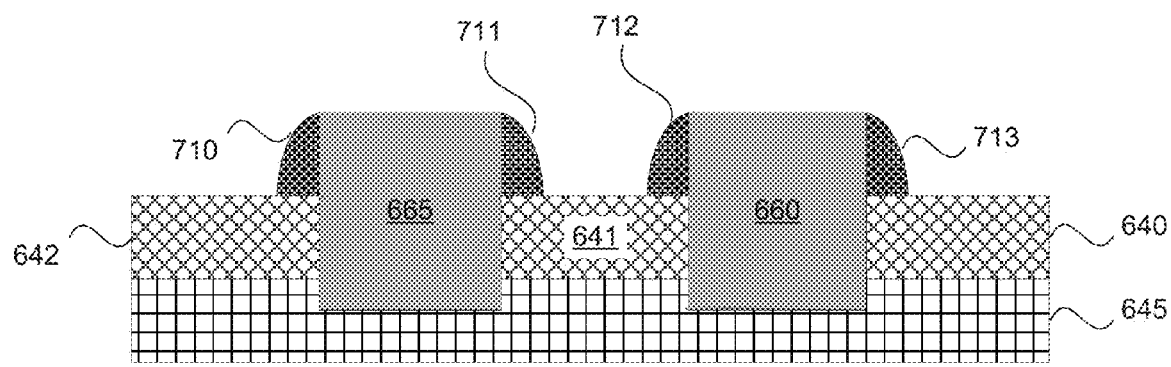
FIG. 7B illustrates a cross-sectional view depicting the formation of spacers adjacent to the exposed sides of the source/drain regions of the structure depicted in FIG. 7A, in accordance with an exemplary embodiment of the present invention.

FIG. 7B illustrates a cross-sectional view depicting the formation of spacers 710-713 adjacent to the exposed sides of the source/drain regions 660 and 665 of the structure depicted in FIG. 7A, in accordance with an exemplary embodiment of the present invention. The formation of spacers such as spacers 710-713 is well understood by those skilled in the art and, as such, a detailed description of such processes is not presented herein.

Figure 8A:
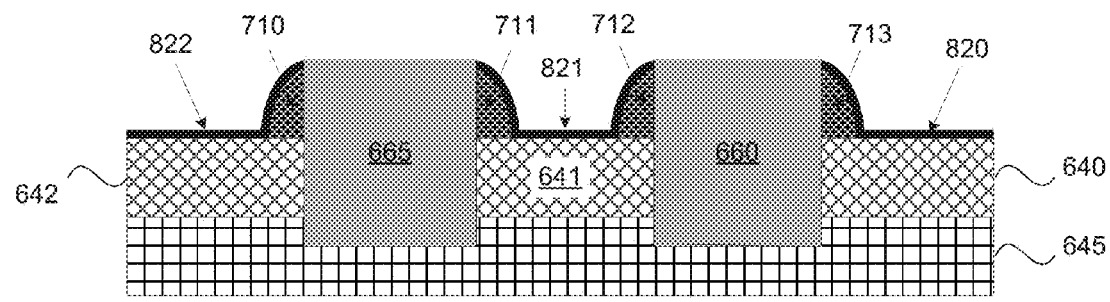
FIG. 8A illustrates a cross-sectional view depicting the formation of gate dielectric layers over the exposed surfaces of the semiconductor channel regions and spacers of the structure depicted in FIG. 7B, in accordance with an exemplary embodiment of the present invention.

FIG. 8A illustrates a cross-sectional view depicting the formation of gate dielectric layers 820-822 over the exposed surfaces of the semiconductor channel regions 640-642 and spacers 710-713 of the structure depicted in FIG. 7B, in accordance with an exemplary embodiment of the present invention. In various embodiments, gate dielectric layers 820-822 are composed of insulators such as silicon dioxide or a high-κ dielectric metal oxide such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The formation of gate dielectric layers such as layers 820-822 is well understood by those skilled in the art and, as such, a detailed description of such processes is not presented herein.

Figure 8B:
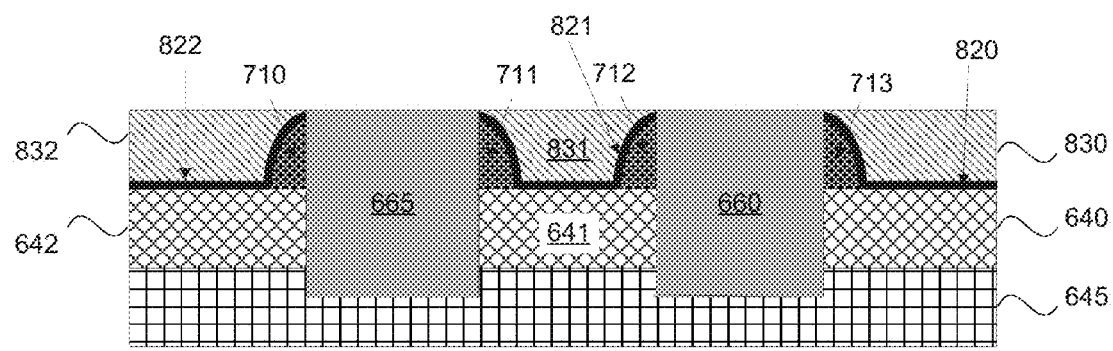
FIG. 8B illustrates a cross-sectional view depicting the formation of gate conductors on the gate dielectric layers of the structure depicted in FIG. 8A, in accordance with an exemplary embodiment of the present invention.

FIG. 8B illustrates a cross-sectional view depicting the formation of gate conductors 830-832 on the gate dielectric layers 820-822 of the structure depicted in FIG. 8A, in accordance with an exemplary embodiment of the present invention. In various embodiments gate conductors 830-832 are composed of a conducting material, such as a metal. The formation of gate conductors such as conductors 830-832 is well understood by those skilled in the art and, as such, a detailed description of such processes is not presented herein.

Figure 8C:
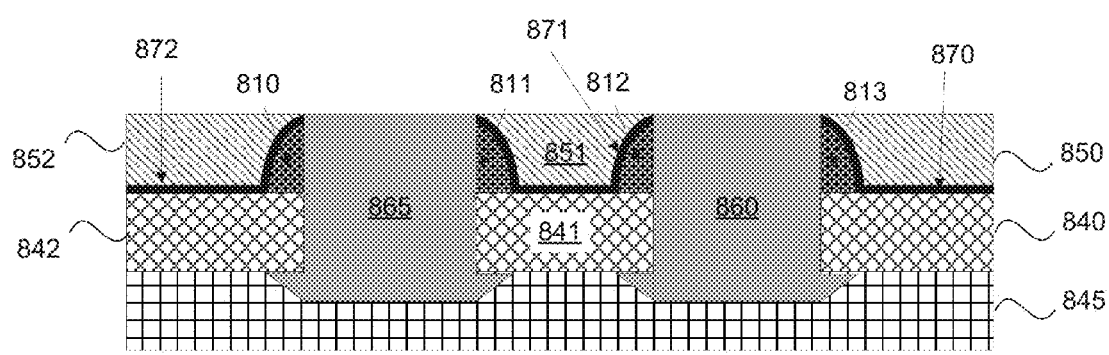
FIG. 8C illustrates a cross-sectional view depicting recessed source/drain regions in a structure analogous to the one depicted in FIG. 8B, in accordance with an exemplary embodiment of the present invention.

FIG. 8C illustrates a cross-sectional view depicting recessed source/drain regions 860 and 865 in a structure analogous to the one depicted in FIG. 8B, in accordance with an exemplary embodiment of the present invention. The elements seen in the embodiment exemplified by FIG. 3B are analogous to those in FIG. 8B. Gate conductors 850-852 are deposited on gate dielectric layers 870-872. Spacers 810 and 811 abut the sidewall portions of source/drain region 865 that project above semiconductor channel region 842 and 841, respectively. Spacers 812 and 813 abut the sidewall portions of source/drain region 860 that project above semiconductor channel region 841 and 840, respectively. Source/drain regions 860 and 865 rest on the lower surfaces of etched SI semiconductor layer 845. Source/drain region 860 is between and in direct contact with semiconductor channel regions 840 and 841. Source/drain region 865 is between and in direct contact with semiconductor channel regions 84 and 842.

Like the structure illustrated in FIG. 3B, the wedging of source/drain regions 860 and 865 underneath semiconductor channel regions 840-842 augments the strain on semiconductor channel regions 840-842 compared to the un-wedged source/drain structures 660 and 665 illustrated in FIG. 8B. In various embodiments, source/drain regions 860 and 865 are composed of semiconductor material that is lattice-mismatched to the semiconductor material of semiconductor channel regions 840-842 as well as lattice-mismatched to the SI semiconductor material of etched SI semiconductor layer 845. In an exemplary embodiment, semiconductor channel regions 840-842 are composed of a III-V semiconductor material, etched SI semiconductor layer 845 is composed of epitaxial SI semiconductor material that is a lattice-matched to the III-V semiconductor material, and source/drain regions 860 and 865 are composed of a III-V semiconductor material that is lattice-mismatched with both semiconductor channel regions 840-842 and the top layer material of etched SI semiconductor layer 845. For example, SI semiconductor layer 845 is composed of epitaxial Fe-doped InP, semiconductor channel regions 840-842 are composed of an alloy that is lattice-matched to Fe-doped InP, such as $In_{0.53}Ga_{0.47}As$, and source/drain regions 860 and 865 are composed of $In_yGa_{(1-y)}As$ where y>0.53 to provide enhanced charge carrier transport in a p-FET device. Alternatively, another example would include source/drain region compositions where y<0.53 to provide enhanced charge carrier transport in an n-FET device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

The methods and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

What is claimed is:
1. A semiconductor structure comprising:
a first semiconductor layer with a first lattice structure;
a second semiconductor layer that is lattice-matched with the first semiconductor layer, wherein the second semiconductor layer is epitaxial with the first semiconductor layer; and
at least two source/drain regions with a second lattice structure, wherein the source/drain regions penetrate the second semiconductor layer and contact the first semiconductor layer, wherein a portion of the second semiconductor layer is between the source/drain regions, wherein the portion has a degree of uniaxial strain that is based, at least in part, on a difference between the first lattice structure and the second lattice structure.
2. The semiconductor structure of claim 1, wherein the first semiconductor layer is further comprised of a semi-insulating semiconductor material.
3. The semiconductor structure of claim 1, wherein one or both of: the second semiconductor layer and the source/drain regions are further comprised of compound semiconductors.

4. The semiconductor structure of claim 1, wherein one or both of: the second semiconductor layer and the source/drain regions are further comprised of ternary semiconductors.

5. The semiconductor structure of claim 1, wherein one or both of: the second semiconductor layer and the source/drain regions are further comprised of III-V semiconductors.

6. The semiconductor structure of claim 1, wherein one or both of: the second semiconductor layer and the source/drain regions include indium.

7. The semiconductor structure of claim 1, wherein one or both of: the second semiconductor layer and the source/drain regions are further comprised of alloys of indium arsenide and gallium arsenide.

8. The semiconductor structure of claim 1, wherein the second semiconductor layer is further comprised of $In_{0.53}Ga_{0.47}As$ and the source/drain regions are further comprised of $In_yGa_{(1-y)}As$, and wherein y has a range between approximately 0.53 and 1.

9. The semiconductor structure of claim 1, wherein the second semiconductor layer is further comprised of $In_{0.53}Ga_{0.47}As$ and the source/drain regions are further comprised of $In_yGa_{(1-y)}As$, and wherein y has a range between 0 and approximately 0.53.

10. A method of forming a semiconductor structure comprising:
    forming a layer of a first semiconductor material on top of a layer of a semi-insulating semiconductor material, wherein the first semiconductor material and the semi-insulating semiconductor material are lattice-matched;
    etching the layer of first semiconductor material to a depth that, at least, exposes the semi-insulating semiconductor material and forms a semiconductor channel region, wherein the semiconductor channel region has a first end and a second end; and
    forming a first source/drain region at the first end of the semiconductor channel region and a second source/drain region at the second end of the semiconductor channel region, wherein the first source/drain region and the second source/drain region are further comprised of a second semiconductor material, wherein the second semiconductor material is lattice-mismatched to the first semiconductor material and to the semi-insulating semiconductor material.

11. The method of claim 10, wherein the etching step provides an isotropic etch.

12. The method of claim 10 further comprising:
    fabricating a gate structure on top of the layer of the first semiconductor material.

13. The method of claim 10 further comprising:
    fabricating a gate structure on top of the semiconductor channel region such that the gate structure is between the first source/drain region and the second source/drain region.

14. The method of claim 10, wherein one or both of the first semiconductor material and the second semiconductor material are further comprised of compound semiconductors.

15. The method of claim 10, wherein one or both of the first semiconductor material and the second semiconductor material are further comprised of III-V semiconductors.

16. The method of claim 10, wherein one or both of the first semiconductor material and the second semiconductor material include indium.

17. The method of claim 10, wherein one or both of the first semiconductor material and the second semiconductor material are further comprised of alloys of indium arsenide and gallium arsenide.

18. A semiconductor structure comprising:
    a semi-insulating semiconductor layer composed of a doped indium phosphide material;
    a semiconductor layer composed of $In_{0.53}Ga_{0.47}As$, wherein the semiconductor layer is epitaxial with the semi-insulating semiconductor layer, wherein the semiconductor layer is lattice-matched with the semi-insulating semiconductor layer; and
    at least two source/drain regions composed of $In_yGa_{(1-y)}As$, wherein y has a range between 0 and 1, wherein the source/drain regions penetrate the semiconductor layer and contact the semi-insulating semiconductor layer, wherein the source/drain regions are lattice-mismatched with the semi-insulating semiconductor layer and the semiconductor layer, wherein a portion of the semiconductor layer is between source/drain regions, wherein the portion has a degree of uniaxial strain that is based, at least in part, on the lattice-mismatch between the source/drain regions and both the semi-insulating semiconductor layer and the semiconductor layer.

19. The semiconductor structure of claim 18, wherein y has a range between approximately 0.53 and 1.

20. The semiconductor structure of claim 18, wherein y has a range between 0 and approximately 0.53.

* * * * *